United States Patent
Wilhelmsson et al.

(10) Patent No.: US 9,350,313 B2
(45) Date of Patent: May 24, 2016

(54) AUTOMATIC GAIN CONTROL OF A RECEIVED SIGNAL USING A POWER TARGET

(71) Applicant: Telefonaktiebolaget L M Ericsson (publ), Stockholm (SE)

(72) Inventors: Leif Wilhelmsson, Dalby (SE); Lars Sundström, Södra Sandby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 14/366,808

(22) PCT Filed: Nov. 29, 2012

(86) PCT No.: PCT/SE2012/051329
§ 371 (c)(1),
(2) Date: Jun. 19, 2014

(87) PCT Pub. No.: WO2013/095261
PCT Pub. Date: Jun. 27, 2013

(65) Prior Publication Data
US 2014/0340153 A1  Nov. 20, 2014

Related U.S. Application Data

(60) Provisional application No. 61/583,338, filed on Jan. 5, 2012.

(30) Foreign Application Priority Data

Dec. 20, 2011 (EP) .................................. 11194563

(51) Int. Cl.
*H04B 1/06* (2006.01)
*H04L 27/08* (2006.01)
(Continued)

(52) U.S. Cl.
CPC ............... *H03G 3/3042* (2013.01); *H03F 3/19* (2013.01); *H03G 3/001* (2013.01); *H03G 3/3078* (2013.01); *H03F 2200/294* (2013.01); *H03F 2200/451* (2013.01)

(58) Field of Classification Search
CPC ..... H03G 3/20; H03G 3/3052; H03G 3/3068; H04L 27/2647; H04L 27/3809; H04B 10/2942; H04B 17/318
USPC ..................... 455/231.1, 234.1, 245.1, 250.1; 375/345, 346
See application file for complete search history.

(56) References Cited

U.S. PATENT DOCUMENTS 4,656,630 A * 4/1987 Miyo .................. H03G 3/3078
  375/345
6,597,898 B1 * 7/2003 Iwata ....................... H03G 3/30
  455/234.1

(Continued)

FOREIGN PATENT DOCUMENTS

EP      1061643 A2    12/2000
EP      1156590 A1    11/2001
(Continued)

OTHER PUBLICATIONS

Kim, Hyungseok et al., "Adaptive Blocker Rejection Continuous-Time ΔΣ ADC for Mobile WiMAX Applications", IEEE Journal of Solid State Circuits, vol. 44, No. 10, Oct. 2009, pp. 2766-2779.
(Continued)

*Primary Examiner* — Quochien B Vuong
(74) *Attorney, Agent, or Firm* — Murphy, Bilak & Homiller, PLLC

(57) ABSTRACT

The present invention relates to a method and device for performing automatic gain control of a received signal. The method comprises the steps of receiving (S101) the signal and amplifying the received signal on the basis of a difference between a power reference value and actual power of the amplified signal. The method further comprises the steps of determining (S102) signal-to-interference ratio of the received signal and controlling (S103) amplification such that the amplified signal attains a target power level by further taking into account the determined signal-to-interference ratio, which target power level is increased as the determined signal-to-interference ratio decreases.

8 Claims, 5 Drawing Sheets

(51) Int. Cl.
*H03G 3/30* (2006.01)
*H03F 3/19* (2006.01)
*H03G 3/00* (2006.01)

(56) References Cited

U.S. PATENT DOCUMENTS

| | | | |
|---|---|---|---|
| 6,843,597 B1 | 1/2005 | Li et al. | |
| 7,366,490 B2 * | 4/2008 | Rouphael | H03G 3/3068 375/345 |
| 7,583,943 B2 * | 9/2009 | Kishi | H03G 3/3052 455/234.2 |
| 7,760,122 B1 | 7/2010 | Zortea | |
| 8,369,467 B2 * | 2/2013 | Kajakine | H03G 3/3068 375/345 |
| 8,588,348 B2 * | 11/2013 | Shimoni | H03G 3/3068 375/316 |
| 9,001,704 B2 * | 4/2015 | Han | H03G 3/3068 455/232.1 |
| 2009/0290516 A1 | 11/2009 | Han et al. | |

FOREIGN PATENT DOCUMENTS

| | | |
|---|---|---|
| EP | 1303053 A1 | 4/2003 |
| EP | 1655848 A1 | 5/2006 |
| WO | 2008117130 A1 | 10/2008 |

OTHER PUBLICATIONS

Reekmans, Stijn et al., "ΔΣ Design Considerations for an UMTS Receiver", 49th IEEE International Midwest Symposium on Circuits and Systems 2006 (MWSCAS '06), vol. 2, 2006, pp. 659-663.

* cited by examiner

AUTOMATIC GAIN CONTROL OF A RECEIVED SIGNAL USING A POWER TARGET

TECHNICAL FIELD

The invention relates to a method of performing automatic gain control of a received signal, a device for performing automatic gain control of a received signal and an analog-to-digital converter comprising a device for performing automatic gain control of a received signal.

BACKGROUND

In the art, when an analog-to-digital converter (ADC) is used to digitize a signal, distortion is inevitably introduced. The degree of distortion depends on the number of bits utilized in the ADC, but it further depends on how well the dynamic range of the ADC is used. On the one hand, the analog signal supplied to the ADC for conversion into the digital domain should not be too weak since the dynamic range of the ADC then is ineffectively used. On the other hand, the signal input to the ADC should not be too strong, as the ADC then frequently will saturate and produce clipping noise. To ensure that the input signal to the ADC has a suitable strength, automatic gain control (AGC) is employed, such that an appropriate trade-off between clipping and effective use of dynamic range is attained.

Thus, the AGC is controlling the strength of the signal input to the ADC such that a suitable trade-off between quantization noise and clipping distortion is obtained. This is to ensure that the bits of the ADC are effectively used. The effect of quantization noise is easily determined, whereas the effect of occasional clipping is harder to determine, and as a consequence, it is quite common to let the AGC control the signal amplitude such that the probability of clipping practically is zero. This design is justified by the fact that poor (i.e. slow and/or inexact) control resulting in a too strong signal supplied to the ADC is typically much worse than in a case where the signal becomes too weak, i.e. an increase in quantization noise is less of a problem than clipping.

This problem is particularly evident in case of adjacent channel interference (ACI). One situation where great adjacent channel interference may be present is when two co-located communication systems are operating in two adjacent frequency bands, for instance where LTE and WiFi functionality are integrated in the same device. In such a case, the interfering signal from WiFi to LTE (or vice versa) may be a 100 dB stronger than the desired signal at the device antenna. Although there is a band-selective filter (B SF) intended to filter out-of-band signals prior to the device receiver, the ACI may only be attenuated by some 40 dB. This implies that the interfering signal entering the receiver may be 60 dB stronger than the desired in-band signal. Now, as this would put far too demanding requirements on the ADC, a low-pass filter is typically implemented prior to the ADC in order to mitigate the requirements on the dynamic range of the ADC. However, this will in practice typically not be enough to cancel the ACI. Now, since a digital receiver system unavoidably must handle the remaining ACI, an AGC is employed for controlling the amplitude of the signal which is input to the ADC.

To conclude, in prior art control schemes, it has been advocated that the signal controlled by the AGC ideally should have an amplitude which exactly fits the full scale voltage range of the ADC. Or in other words, the signal which is controlled by the AGC—i.e. the signal which is input to the ADC—should optimally have an amplitude that exactly fits the allowed input range of the ADC, in order to best make use of the ADC dynamic range. If the amplitude of the signal input to the ADC is any higher, the ADC will saturate and ultimately produce a defective digitized output signal (signal saturation/clipping will additionally have further deteriorating and non-linear effects on the system which are difficult to value beforehand). On the other hand, if the amplitude of the signal input to the ADC is much lower than the ADC input range, there is a risk that the signal is overly affected by quantization noise. This is particularly problematic in the presence of strong adjacent channel interfering signals, in which case the desired signal will occupy a relatively small portion of the total ADC input voltage range.

As was mentioned, in the art, the AGC is configured such that clipping in the ADC is avoided, implying that a great safety margin must be used for the amplified signal with respect to allowed ADC input voltage range. In the presence of strong interfering signals, substantial quantization noise is caused for the desired signal since a large portion of the ADC full scale voltage range is used for quantizing the interfering signal. The quantization noise for the desired signal can of course be decreased by using an ADC with greater resolution; the quantization noise will decrease with an increased number of bits in the ADC. However, this is not a feasible solution as the system cost and power consumption increase as the number of bits employed by the ADC increases. As a rough estimate, the power consumption of an ADC doubles as the number of quantization levels is increased by a factor of two.

SUMMARY

An object of the present invention is to solve, or at least mitigate the above mentioned problems in the art.

This object is achieved in a first aspect of the present invention by a method of performing automatic gain control of a received signal. The method comprises the steps of receiving the signal and amplifying the received signal on the basis of a difference between a power reference value and actual power of the amplified signal. The method further comprises the steps of determining signal-to-interference ratio of the received signal, and controlling amplification such that the amplified signal attains a target power level by further taking into account the determined signal-to-interference ratio, said target power level being increased as the determined signal-to-interference ratio decreases.

This object is achieved in a second aspect of the present invention by a device for automatically controlling gain of a received signal. The device is arranged to receive a signal and control amplification of the received signal on the basis of a difference between a power reference value and actual power of the amplified signal. The device is further arranged to determine signal-to-interference ratio of the received signal and control amplification such that the amplified signal attains a target power level by further taking into account the determined signal-to-interference ratio, said target power level being increased as the determined signal-to-interference ratio decreases.

This object is achieved in a third aspect of the present invention by an analog-to-digital converter being arranged with an AGC device according to the second aspect.

The present invention is advantageous in that the power level of the amplified signal is controlled in a manner such that the dynamic range of the ADC is efficiently utilized. Hence, by controlling the target power level of the amplified signal, the headroom of the amplified signal is also controlled in that if the power level is increased, the headroom decreases, whereas a decrease in power level will increase the headroom.

The device being arranged to control the power of the amplified signal is embodied in the form of an automatic gain control (AGC) device, and in an aspect of the present invention, the AGC device is arranged to control the power level of the input signal of a subsequently arranged analog-to-digital converter (ADC). The inventors have come to the insight that the maximal power level that can be allowed for a signal supplied to an ADC before distortion/clipping occurs varies with degree of signal interference. Investigations show that the greater the interference, the more insensitive to signal clipping the ADC is with respect to selected power level of the signal supplied to the ADC. Thus, the headroom of the amplified signal—i.e. the difference between a nominal signal value and a maximum undistorted value—which is input to the ADC is advantageously controlled to be greater the less the interference content of the signal is. Thus, with the AGC device of the present invention, the power level of the signal input to the ADC is controlled on the basis of the level of interference that the signal is subject to; a greater level of interference implies that the ADC is less sensitive to clipping, thus resulting in a signal controlled by the AGC with a target power level selected to be higher as compared to the power level of the signal controlled by the AGC when the level of interference is low. By increasing the power level of the signal controlled by the AGC in case of a higher degree of interference, i.e. by appropriately increasing the gain/amplification of the signal input to the ADC, the dynamic range of the ADC is better utilized and ADC quantization noise decreases. As previously was mentioned, when the interference content of the received signal is high, the effects of clipping noise in the ADC is much less detrimental to the signal to be quantized in terms of signal-to-noise ratio (SNR) of the digitized signal at the ADC output. As a result, by taking the signal-to-interference ratio (SIR) into account when amplifying a received signal in accordance with the present invention, quantization noise is minimized while at the same time the amount of clipping noise introduced can be carefully controlled.

As subsequently will be shown, it exists an optimal headroom value for a signal input to an ADC in terms of SNR of the digitized signal at the ADC output, and the power of the signal can thus be controlled to lie at, or close to, a level corresponding to the optimal headroom value for any given degree of interference. It will subsequently also be shown that the higher the interference, the greater the variation in ADC input signal headroom is allowed while still maintaining a required SNR.

In an embodiment of the present invention, the target power level is controlled to lie in one of a number of ranges, where each range is defined by a predetermined lower power threshold and an upper power threshold. The actual range which the target power level is controlled to lie within is dependent on the determined signal-to-interference ratio. When evaluating the SNR of a signal output from an ADC for different determined SIRs of a received signal which eventually will be input to the ADC, it can be seen that for each SIR, a power level range can be defined for the input signal where an appropriate trade-off is made between quantization noise on the one hand and clipping noise on the other. Further, this range is wider the lower the SIR. Thus, the power range delimited by the two threshold values can be configured to be broader as interference increases. Advantageously, by controlling the target power level of the amplified signal to lie in a range delimited by a lower and an upper predetermined threshold value, each range typically being different for different SIRs, the AGC device can operate across a span of amplification values; the span being greater for a signal subject to greater interference.

In a further embodiment of the present invention, the target power level of the amplified signal controlled by the AGC is arranged to be set to one of two predetermined power values, a lower power value being used in case interference is determined to be absent and an upper power value being used in case interference is determined to be present. Thus, when determining the signal-to-interference ratio of the received signal, the signal is considered to be subject to interference in case the SIR is below a predetermined threshold. If this is not the case, interference is considered absent. Advantageously, by means of using an on-off determination with respect to interference, the amplification control becomes very simple and straightforward. This could be particularly advantageous in case the present invention is to be implemented in an integrated circuit ADC where processing resources may be scarce.

In a further embodiment of the present invention, the signal-to-interference ratio of the received signal is determined by (a) determining the power of the amplified signal before the amplified signal is converted into a digital signal, and (b) filtering the analog-to-digital converted signal to cancel potential interference signals and determining power of the filtered digital signal.

BRIEF DESCRIPTION OF THE DRAWINGS

The invention is now described, by way of example, with reference to the accompanying drawings, in which.

DETAILED DESCRIPTION

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art.

Figure 1:
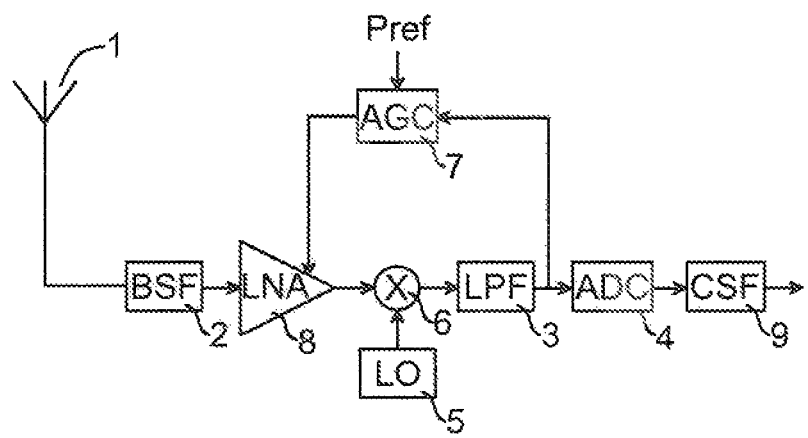
FIG. 1 illustrates a prior art AGC structure delivering a gain-controlled signal to an ADC.

FIG. 1 exemplifies a prior art AGC structure delivering a gain-controlled signal to an ADC. For receivers used in wireless communication systems, the ADC plays an important role, both in terms of obtaining good performance and in terms of total power consumption in the receiver. Some of the processing in a receiver might in principle either be done in the analog domain, i.e., before the ADC, or in the digital domain, i.e., after the ADC. An example of such processing is channel filtering, where a desired signal is passed through more or less intact for further processing while non-desired signals (like interference) on adjacent channels are greatly attenuated. If this filtering is done in the analog domain, the spread of the analog filters must be considered. That is, the attenuation of the adjacent channel interference as well as the insertion loss caused on the desired signal will vary from one receiver to another. This means that a substantial implementation margin is needed to ensure that most receivers say 99.9%, will meet the requirements on ACI. Furthermore, component variations make the design of high-order analog filters a troublesome task.

If instead the filtering is performed in the digital domain, the filter for suppressing the ACI is digital, and can therefore be made identical for all receivers. As long as requirements such as processing time, size, and power are met, a digital filter of any order can be designed. However, for digital filtering to work properly, the signal must be digitized to a sufficient number of bits with sufficiently small distortion. Hence, on the one hand a large number of bits are required to ensure that the processing in the digital domain will work properly. On the other hand, the power consumption in an ADC is roughly proportional to the number of quantization levels. That is, for every extra bit in the ADC, thereby doubling the number of quantization levels, the power consumption is increased by a factor of two.

With reference to FIG. 1, in case a strong interfering signal is present at antenna 1, its attenuation will depend on the frequency separation between the desired signal and the interfering signal received by the antenna, as well as the effectiveness of the band selective filter (BSF) 2 and the low-pass channel-selective filter (LPF) 3 preceding ADC 4. A local oscillator (LO) 5 and a mixer 6 is employed to convert the RF signal at the antenna down to baseband. At the antenna, the interfering signal might be as much as 100 dB stronger than the desired signal, but at the input to the ADC, the situation will have approved greatly although the interfering signal still may be much stronger than the desired signal. To ensure that the input signal to the ADC has a suitable strength, AGC is employed. Since the incoming signal at the antenna 1 typically varies over a wide dynamic range, an AGC circuit 7 must be utilized to provide a signal with relatively constant maximum amplitude at the ADC input such that the ADC requires less dynamic range. Thus, the gain is controlled such that an appropriate trade-off between clipping and effective use of dynamic range is attained. The AGC controls the strength of the signal that reaches the ADC by controlling the gain of low-noise amplifier (LNA) 8. In a practical implementation, there are several amplifiers in the receiver chain, thereby facilitating distributed gain. Basically, if the signal into the LNA is strong, less amplification is used, whereas if the signal is weak, the AGC circuit increases the amplification in the LNA. Specifically, the power level of the signal that reaches the ADC is determined and the gain of the LNA is controlled based on the power level, creating a closed-loop control system. Thus, the AGC circuit 7 controls the power of the received signal passing through the LNA 8 on the basis of a difference between a power reference value $P_{ref}$ and actual power level of the amplified signal at the ADC input. Thus, the closed loop-control system will strive at producing a signal at the ADC input which follows the reference signal $P_{ref}$ applied to the AGC. It should be noted that FIG. 1 shows a prior art receiver chain for illustrating purposes only; the power is determined at a single location immediately prior to the ADC. In practice, the power may be measured at several places. Further, many other receiver chain structures are possible.

Figure 2:
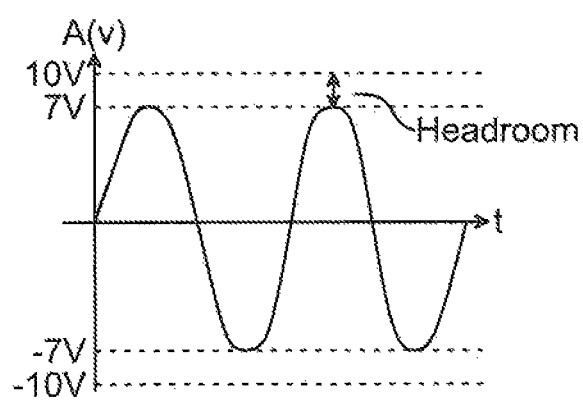
FIG. 2 illustrates headroom of a signal.

With reference to FIG. 2, the maximal amplitude of the signal supplied to an ADC that can be attained without causing distortion is dictated by the full scale voltage range of the ADC. In other words, assuming that the full scale voltage range of an ADC is set to −10−+10 V, then a signal input to the ADC exceeding the range, for instance an 11 V-signal, will saturate the ADC and ultimately produce an erroneous digitized output signal. This is illustrated in FIG. 2 where the full scale voltage range of the ADC hence is 10−(−10)=20 V, meaning that a sinusoidal signal input to the ADC with an amplitude ranging from −7 V to +7 V will have a clipping "margin" of 3 V. Thus, the remaining headroom is 3 V; if the signal input to the ADC increases by another 3 V, all headroom has been utilized and any further increase in signal level results in clipping.

To analyse the distortion introduced by an ADC, the distortion is separated into quantization noise (QN) and clipping noise (CN), and the total distortion is the sum of the two noise types. In the following, it is assumed that the input signal amplitude follows a Gaussian distribution. This is in particular a reasonable assumption in case the signal is an orthogonal frequency-division multiplexing (OFDM) signal.

To introduce some notation, the number of bits in the ADC are denoted b and these bits can represent $2^b$ quantization levels equidistantly placed between −c and c (i.e. over the full scale voltage range). Assuming that the quantization error is uniformly distributed, which is reasonable as long as the number of quantization levels is not too small, the quantization noise is given by $$QN = \frac{\Delta^2}{12} = \frac{(2c)^2}{12 \cdot 2^b} = \frac{c^2}{3 \cdot 2^b}.$$

To evaluate the distortion caused by clipping, the effect of clipping must be integrated over the probability density function of the amplitude. As the amplitude is Gaussian, and the clipping only occurs for amplitudes larger than c, it can be shown that for a signal normalized to a variance of unity $$CN = 2\left(Q(c)\cdot\left(1+c^2\cdot(1-2^{-b})^2\right)-\frac{c}{\sqrt{2\pi}}e^{(-0.5c^2)(1-2^{(1-b)})}\right),$$

where Q(x) is the complementary Gaussian distribution function. The total distortion is then QN+CN.

When studying the respective expression given hereinabove, it is readily seen that the quantization noise QN increases with an increased range c, while the clipping noise CN decreases with an increased range c, as expected. Since quantization noise is the difference (i.e. rounding error) between the original analog signal and the digitized signal and maximally can be a half least significant bit (LSB), it will increase with an increased full scale voltage range as each bit will represent a greater voltage, while a greater full scale voltage range inevitably will decrease the risk of subjecting the signal to clipping. With the signal power normalized to unity, it follows that c can be viewed as the headroom over the average power. For instance, if c=5, the headroom is 20 log (5)=14 dB. Finally, the SNR at the output of the ADC is defined as the signal power divided by the total distortion $$SNR = \frac{S}{QN + CN}.$$

Figure 3:
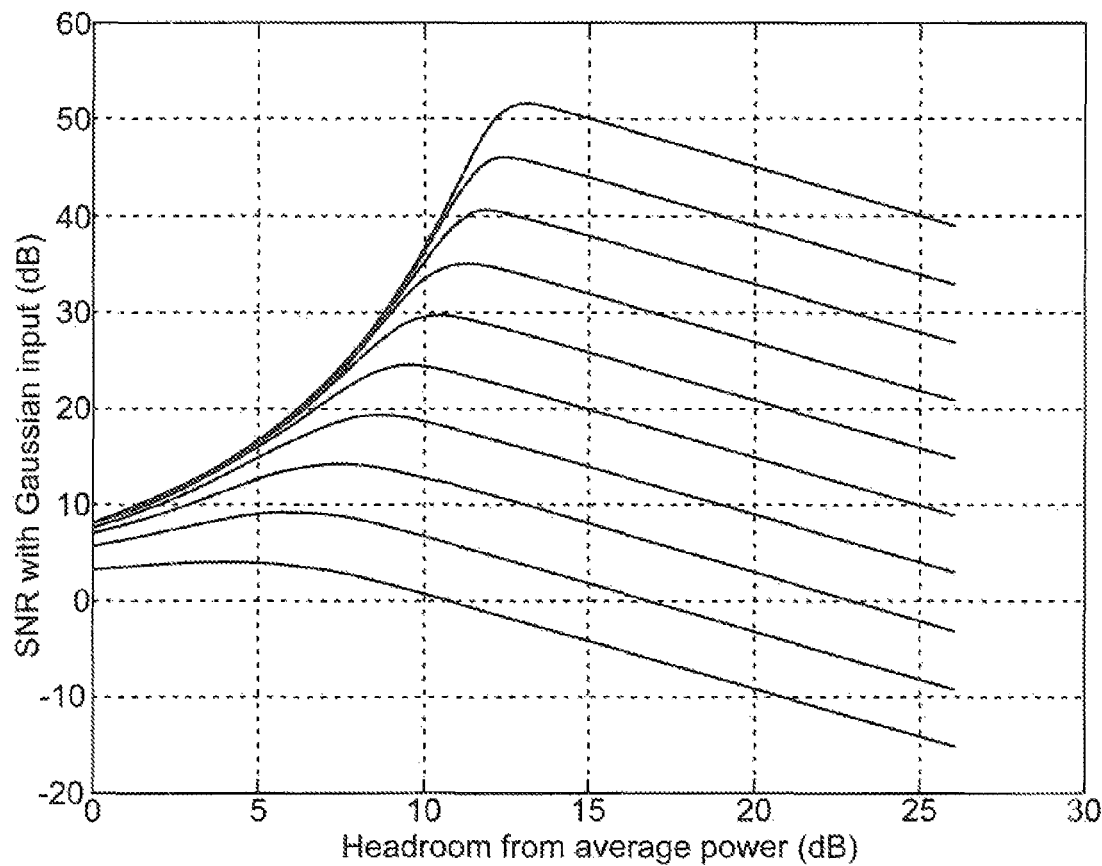
FIG. 3 illustrates SNR at the output of an ADC as function of selected headroom over average power in case of Gaussian input.

FIG. 3 illustrates SNR at the output of an ADC as function of selected headroom over average power in case of Gaussian input. The curves correspond to the number of bits in the ADC being in the range from 1 to 10, where a 10-bit ADC is represented by the upper curve and 1-bit ADC is represented by the lower curve. For instance, in case the ADC has 10 bits, the maximum SNR that can be obtained is about 51 dB and this is obtained for a selected headroom of roughly 13 dB.

Some conclusions can be made from FIG. 3: first, if the headroom is selected to be larger than the optimum value (i.e. the power level of the signal input to the ADC is decreased) the loss is a dB-for-dB loss as the SNR is essentially determined by the quantization noise; it can be seen that an increase in headroom from 15 dB to 25 dB essentially results in a decrease in SNR from 50 dB to 40 dB. Second, selecting a headroom that is x dB below the optimum value (i.e. the power level of the signal input to the ADC is increased) is considerably worse than selecting a headroom that is x dB above the optimum value, for any given value x. Third, when the performance is determined by the quantization noise, i.e. when the selected headroom is at or above the optimal value, the gain in using an addition bit in the ADC is 6 dB. Finally, the optimum value of the headroom is decreased as the number of bits is decreased; that is, when the number of bits decreases, the power level of the signal input to the ADC can be increased such that optimal headroom is achieved.

With reference again to FIG. 3, assuming that an interfering signal is 30 dB stronger than the desired signal at the input of the ADC, i.e. SIR=−30 dB, and the interfering signal is Gaussian, with 10 bits and an optimal headroom in the ADC, the SNR would then be 51 dB (provided that the signal is taken to be both the desired and the interfering signal) at a headroom of 13 dB, but the SNR for the desired signal can be expected to be only 51−30=21 dB. In the Figure, with a headroom of 13 dB and an SNR for the desired signal of 21 dB, moving from the 10 bit-curve down to the 5-bit curve, these numbers correspond well with the fact that the number of bits effectively used for quantizing the desired signal in he ADC is 5. Further, because one bit corresponds to 6 dB, another 5 bits (i.e. 30 dB) are used for the interfering signal. Further, it can be seen that for a signal passing through a hypothetic 5-bit ADC, the effective SNR can be increased to about 24 dB, if the headroom is decreased to about 10 dB. Hence, quantization noise affects the desired weak signal to a relatively higher degree, whereas clipping noise affects the interfering strong signal to a relatively higher degree.

Figure 4:
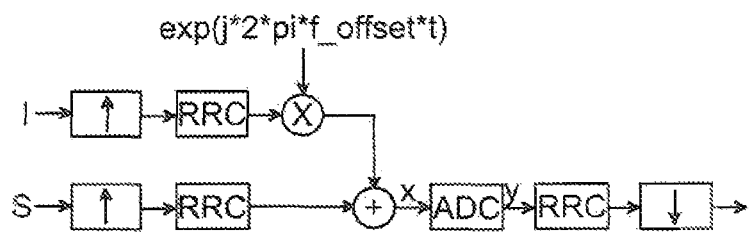
FIG. 4 shows a simulation set-up.
Figure 5:
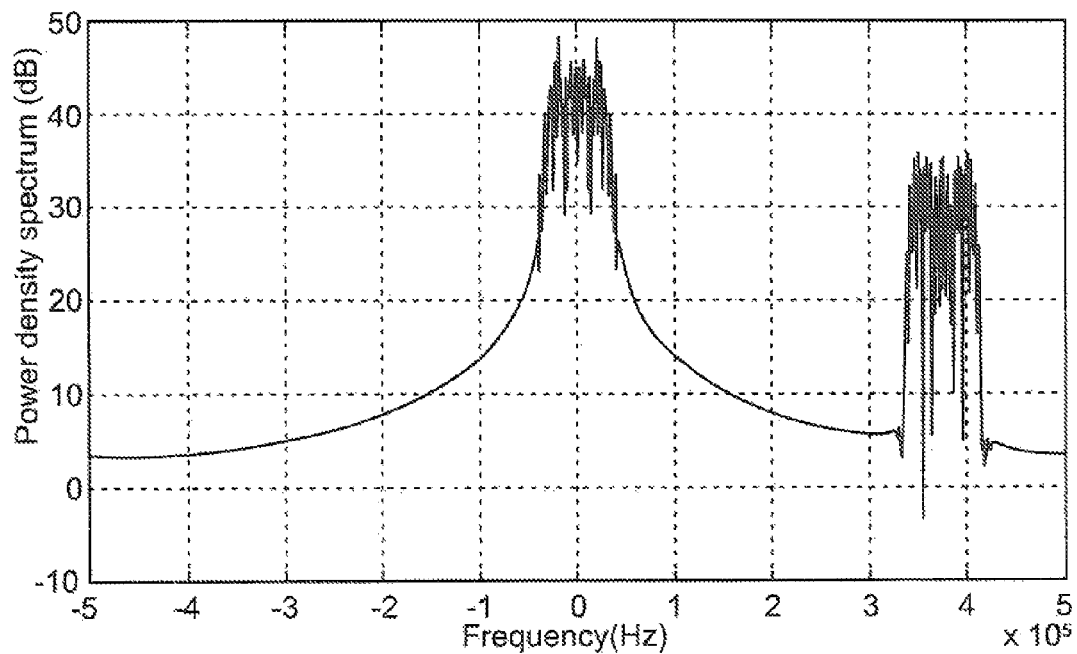
FIGS. 5 and 6 illustrates power spectrum density looks like at the input of an ADC in case of SIR=10 dB and SIR=−30 dB, respectively.
Figure 6:
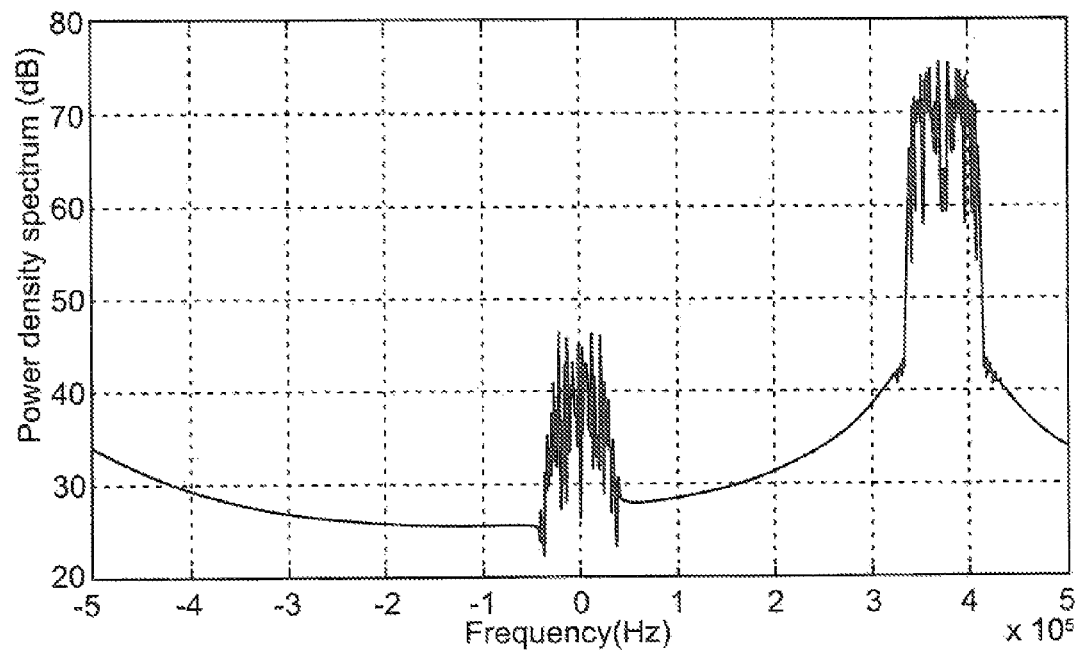

Now, to evaluate whether in case of strong interference decreased headroom actually can substantially increase the SNR for the desired signal, simulations were performed. The simulation set-up is shown in FIG. 4. The desired signal, S, as well as the interfering signal, I, are filtered through a respective root-raised cosine (RRC) filter, to ensure that the two signals when subsequently added to each other will not interfere with one another by other means than those caused by the quantization effects in the ADC. The interfering signal I is further mixed with a signal that up-converts the interfering signal to an adjacent channel. As will be seen in the two subsequent figures, the interfering signal I is offset with just under 4 MHz. The RRC filter is over-sampled with a factor of 16. This over-sampling is then compensated by using two less bits in the ADC (an over-sampling of factor of 4 has the same effect as increasing the number of bits in the ADC by one). The desired signal S is at baseband, while the interfering signal I is up-converted in such a way that it will be within the Nyquist range of the ADC but in the stop-band of the RRC filter following the ADC in the receiver. This has the effect that the impact of the interferer will be isolated to the non-linear effects of the ADC. Examples of what the power spectrum density looks like at the input of the ADC in case of SIR=10 dB and SIR=−30 dB are shown in FIGS. 5 and 6, respectively.

Figure 7:
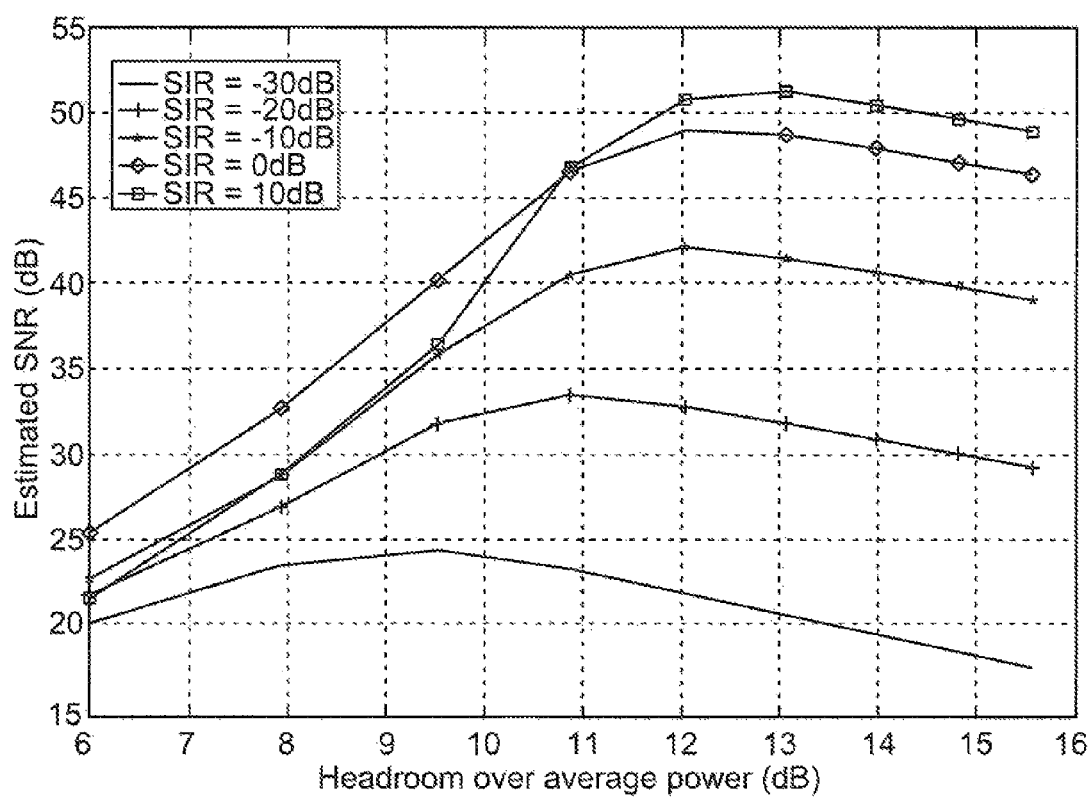
FIG. 7 shows performance results obtained using the simulation set-up depicted in FIG. 4.

FIG. 7 shows performance results obtained using the simulation set-up depicted in FIG. 4, showing how the SNR depends on the headroom for various values of SIR of a signal input to an ADC. As can be seen, the simulations verify the hypothesis that the smaller SIR—i.e. the stronger the interference—the smaller the headroom should be selected. Hence, according to an embodiment of the present invention, an AGC is configured to control amplification of a signal provided to an ADC such that the amplified signal attains a target power level by taking into account the determined SIR of the signal, where the target power level is increased as the determined SIR decreases. Or in other words, the corresponding target headroom is decreased as the determined SIR decreases. It can also be noted that in case of strong interference, selecting the target headroom to be slightly smaller than optimum has less of an impact than would be the case with little or no interference.

As an example, the upper curve illustrates a situation where the SIR is 10 dB, i.e. the signal level is 10 dB higher than the interference level. Assuming that an SNR in the range of 50-52 dB is required, a corresponding headroom target range would amount to just under 12 dB up to slightly more than 14 dB. That is, in this particular example the headroom span for maintaining the required SNR is about 2.5 dB. The lower curve illustrates a situation where the SIR is −30 dB, which effectively means that the interference level is 1000 times that of the desired signal. Assuming that an SNR in the range of 22-24 dB is required, a corresponding headroom target range would amount to slightly more than 7 dB up to just under 12 dB. That is, in this example where for the signal the interference is much more severe, the headroom span for maintaining the required SNR is about 4.5 dB. This implies that headroom can be selected with less accuracy the greater the interference content of the signal input to the ADC. To illustrate this further, for a SIR of 10 dB, a maximum SNR of 52 dB is attained at a headroom of about 13 dB. If the headroom is lowered with 3 dB, i.e. the power level of the signal input to the ADC is increased with 3 dB, the signal is subjected to clipping, and the SNR drops sharply to 40 dB. However, for a SIR of −30 dB, a maximum SNR of 24 dB is attained at a headroom of about 9.5 dB. If the headroom is lowered with 3 dB, i.e. the power level of the signal input to the ADC is increased with 3 dB, the signal is not affected by clipping to any greater extent, and the SNR only drops to about 21 dB.

In an embodiment of the present invention, the target power level is controlled to lie in one of a number of ranges, where each range is defined by a predetermined lower power threshold and an upper power threshold. The actual range which the target power level is controlled to lie within is dependent on the determined SIR of the signal input to the ADC. With reference made to the previous examples, a first power range which corresponds to a headroom having a lower threshold of just under 12 dB and an upper threshold slightly above 14 dB is defined for a SIR of 10 dB. The target power level is thus controlled by the AGC to provide a corresponding headroom value within these limits. As can be seen in FIG. 7, this results in an SNR which does not stray too much from the optimal, and the clipping noise is at an acceptable level.

A second power range which corresponds to a headroom having a lower threshold of slightly more than 7 dB and an upper threshold just less than 12 dB is defined for a SIR of −30 dB. The target power level is thus controlled by the AGC to provide a corresponding headroom value within these limits in case it is determined that the signal input to the ADC actually has this level of interference or at least this selected interference is considered to match the actual interference best. As can be seen in FIG. 7, this also results in an SNR which is not very far from the optimal, and the clipping noise is at an acceptable level, even though the second power range is almost twice as broad as the first range. The more ranges that are defined, the more exact the control of the target power level of the signal input to the ADC will be.

In an alternative embodiment, the target power level of the amplified signal controlled by the AGC is arranged to be set to one of two predetermined power values, a lower power value being used in case interference is determined to be absent and an upper power value being used in case interference is determined to be present. Thus, when determining the SIR of the received signal, the signal is considered to be subject to interference in case the SIR is below a predetermined threshold. If this is not the case, interference is considered absent. Advantageously, by means of using an on-off determination with respect to interference, the amplification control becomes simple and straightforward. This could be particularly advantageous in case the present invention is to be implemented in an integrated circuit ADC where processing resources may be scarce.

Figure 8:
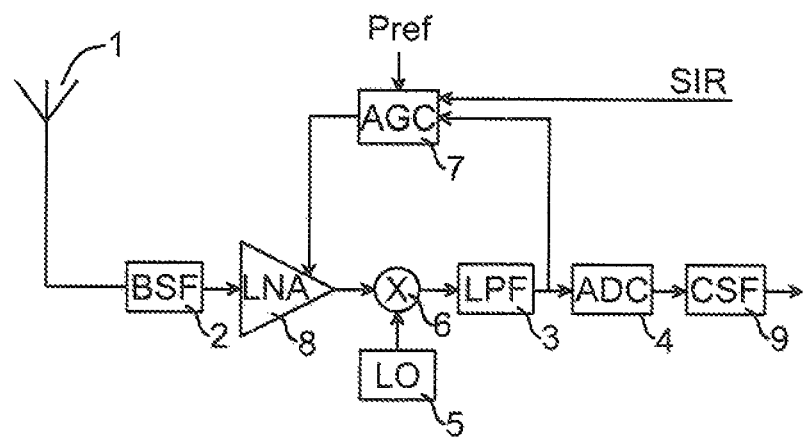
FIG. 8 illustrates an AGC according to an embodiment of the present invention.

FIG. 8 illustrates an AGC according to an embodiment of the present invention, similarly to the receiver chain shown in FIG. 1, an antenna 1 receives a signal which to a greater or lesser degree contains interference, the attenuation of which will depend on the frequency separation between the desired signal and the interfering signal received by the antenna, as well as the effectiveness of the BSF 2 and the LPF 3 preceding ADC 4. An LO 5 and a mixer 6 are employed to convert the RF signal at the antenna down to baseband. Again, due to signal strength fluctuations at the antenna, an AGC circuit 7 must be utilized to provide a signal with appropriate amplitude at the ADC input to best make use of the ADC dynamic range. The AGC controls the strength of the signal that reaches the ADC by controlling the gain of the LNA 8. The power level of the signal that reaches the ADC is determined and the gain of the LNA is controlled based on the power level, creating a closed-loop control system. Thus, the AGC circuit 7 amplifies the received signal passing through the LNA 8 on the basis of a difference between a power reference value $P_{ref}$ and actual power level of the amplified signal at the ADC input. However, in the present invention, the AGC will also take the SIR of the received signal into account. This is indicated in FIG. 8 in that SIR is supplied to the AGC circuit 7. In an embodiment of the present invention, the SIR is determined by determining the power of the amplified signal before the amplified signal is converted into a digital signal, i.e. after LPF 3, thereby attaining a signal comprising both the desired signal and the interference. After the analog amplified signal has been digitized, a channel selective filter (CSF) 9 aims at cancelling all or most of the interference, thus passing through the desired signal. Thus, after CSF 9, the power of the filtered digital signal is determined, wherein the SIR can be calculated and delivered to the AGC circuit 7.

It should be noted that the AGC circuit may comprise, or be controlled by, a processor arranged to execute program code downloaded to a suitable storage area associated with the processor, such as a RAM, a Flash memory or a hard disk. In an embodiment of the present invention, the processor is arranged to at least partly carry out the method according to the present invention when appropriate program code comprising computer-executable components is downloaded to the memory and executed by the processor. The processor may alternatively be embodied in the form of an application specific integrated circuit (ASIC), a field-programmable gate array (FPGA), a complex programmable logic device (CPLD), etc. Further, $P_{ref}$ illustrates the reference value to be used by the AGC for different values of SIR. The reference value $P_{ref}$ may e.g. be supplied to the AGC circuit 7 as an external input signal, or it may be implemented by means of a look-up table within the AGC circuit, or in any other appropriate manner which can ensure that a reference value is provided to the AGC circuit. The AGC circuit could be controlled by a reference value derived from any appropriate electrical parameter, such as voltage, current, power, etc.

Figure 9:
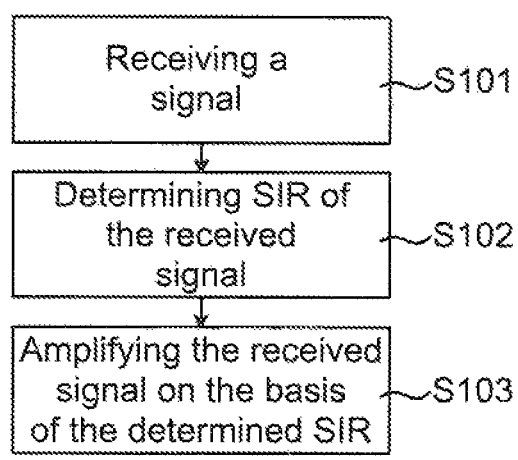
FIG. 9 illustrates a flowchart of a method for performing AGC according to an embodiment of the present invention.

FIG. 9 illustrates a flowchart of a method for performing AGC according to an embodiment of the present invention. First, a signal is received in step S101. Then, in step S102, the SIR of the received signal is determined. Thereafter, in step S103, amplification of the received signal is controlled such that the amplified signal attains a target power level. This is performed by taking into account the determined signal-to-interference ratio, wherein the target power level is increased as the determined signal-to-interference ratio decreases, as has been described in the above.

As has been described in the above for the present invention, the SIR of a received signal is determined. With reference to FIG. 8, the SIR of the received signal can in practice be determined at a number of different locations in the receiver chain; after the band selective filter 2, at the input of the ADC 4, etc. In case an interfering signal is generated within the device itself, being e.g. a mobile phone, in which the AGC is implemented, which is possible for example if the interfering signal is a WiFi signal whereas the system subject to the interference is LTE, knowledge of transmit power is readily available within the device and the SIR can be determined from estimation without doing any measurements.

Even though the invention has been described with reference to specific exemplifying embodiments thereof, many different alterations, modifications and the like will become apparent for those skilled in the art. The described embodiments are therefore not intended to limit the scope of the invention, as defined by the appended claims.

The invention claimed is:

1. A method of automatic gain control (AGC) in a receiver comprising: comprising:
    amplifying a received signal in an AGC circuit of the receiver, to obtain an amplified signal, said amplified signal including a desired signal and an interfering signal comprising adjacent channel interference;
    digitizing the amplified signal via an analog-to-digital converter, to obtain a digital signal;
    filtering the digital signal via a channel-selective digital filter having a stop-band outside the desired signal and a pass-band corresponding to the desired signal to obtain a filtered digital signal for processing;
    determining a signal-to-interference ratio (SNR) as a function of the power of the amplified signal before digitization, and the power of the filtered digital signal; and
    controlling the gain of the AGC circuit, so that the ananlog-to-digital converter operates with increased headroom for one or more first ranges of SIR and operates with decreased headroom for one or more lower, second ranges of SIR.

2. The method according to claim 1, wherein controlling the gain of the AGC circuit comprises operating the AGC circuit with a target power level for the amplified signal that lies within a power range that is depenedent upon the SIR.

3. The method of claim 2, wherein a number of power ranges are defined, each power range corresponding to a different SIR range, and wherein controlling the gain of the ACG circuit comprises identifying the power range corresponding to the SIR, as determined, and operating the AGC circuit such that it maintains the power of the amplified signal within the identified power range.

4. The method of claim 1, wherein controlling the gain of the AGC circuit comprises, when the adjacent channel interference is below a defined threshold, operating the AGC circuit with a first target power level that corresponds to a first amount of headroom in the analog-to-digital converter, and, when the adjacent channel interference is not below the defined threshold, operating the AGC circuit with a second target power level that corresponds to a lower, second amount of headroom in the analog-to-digital converter.

5. A receiver comprising:
an automatic gain control (AGC) circuit configured to amplify a signal received by the receiver, to obtain an amplified signal, said amplified signal including a desired signal and an interfering signal comprising adjacent channel interference;
an analog-to-digital converter configured to digitize the amplified signal, to obtain a digital signal; and
a channel-selective digital filter having a stop-band outside the desired signal and a pass-band corresponding to the desired signal, and configured to filter the digital signal to obtain a filtered digital signal for processing;
wherein the AGC circuit is further configured to:
determine a signal-to-interference ratio (SIR) as a function of the power of the amplified signal before digitization, and the power of the filtered digital signal; and
control the gain of the AGC circuit, so that the analog-to-digital converter operates with increased headroom for one or more first ranges of SIR and operates with decreased headroom for one or more lower, second ranges of SIR.

6. The receiver of claim 5, wherein the AGC circuit is configured to control the gain of the AGC circuit by operating the AGC circuit with a target power level for the amplified signal that lies within a power range that is dependent upon the SIR.

7. The receiver according to claim 6, wherein a number of power ranges are defined, each power range corresponding to a different SIR range, and wherein the AGC circuit is configured to control the gain of the AGC circuit by identifying the power range corresponding to the SIR, as determined, and operating the AGC circuit such that it maintains the power of the amplified signal within the identified power range.

8. The receiver of claim 5, wherein the AGC circuit is configured to control the gain of the AGC circuit by, when the adjacent channel interference is below a defined threshold, operating the AGC circuit with a first target power level that corresponds to a first amount of headroom in the analog-to-digital converter, and, when the adjacent channel interference is not below the defined threshold, operating the AGC circuit with a second target power level that corresponds to a lower, second amount of headroom in the analog-to-digital converter.

* * * * *